United States Patent [19]

Matsui et al.

[11] Patent Number: 5,331,225
[45] Date of Patent: Jul. 19, 1994

[54] BICMOS LOGIC CIRCUIT WITH BIPOLAR TRANSISTOR AND MOS TRANSISTOR FORMED ON THE SAME SEMICONDUCTOR SUBSTRATE

[75] Inventors: Masataka Matsui, Tokyo; Yukihiro Urakawa, Kawasaki, both of Japan

[73] Assignee: Kabushiki Kaisha Toshiba, Kawasaki, Japan

[21] Appl. No.: 970,240

[22] Filed: Nov. 2, 1992

Related U.S. Application Data

[63] Continuation of Ser. No. 735,043, Jul. 24, 1991, abandoned.

[30] Foreign Application Priority Data

Jul. 25, 1990 [JP] Japan .................................. 2-194983

[51] Int. Cl.⁵ .......................................... H03K 19/02
[52] U.S. Cl. ................................... 307/446; 307/455; 307/544; 307/570
[58] Field of Search ............... 307/446, 455, 443, 544, 307/570

[56] References Cited

U.S. PATENT DOCUMENTS

| | | |
|---|---|---|
| 4,626,709 | 12/1986 | Mazumder et al. ............... 307/446 |
| 4,868,421 | 9/1989 | Herndon et al. .................. 307/446 |
| 4,943,741 | 7/1990 | Estrada et al. ................. 307/272.1 |
| 4,992,681 | 2/1991 | Urakawa et al. ................ 307/475 |
| 5,003,199 | 3/1991 | Chuang et al. .................. 307/446 |
| 5,059,829 | 10/1991 | Flannagan et al. ............... 307/446 |

Primary Examiner—Robert J. Pascal
Assistant Examiner—Michael Shingleton
Attorney, Agent, or Firm—Finnegan, Henderson, Farabow, Garrett & Duner

[57] ABSTRACT

In a Bi-CMOS logic circuit in which a bipolar transistor and a CMOS element are formed on the same semiconductor substrate, a pull-down current of an output circuit is discharged through a MOS transistor having a large transconductance gm and a constant current source having a large current value. Thus, the speed of a pull-down operation is increased. Moreover, a constant current source need not be provided in an output circuit, and the MOS transistor is operated when it is required during a pull-down operation, thereby reducing an extra current. Therefore, a circuit having low power consumption can be obtained.

5 Claims, 2 Drawing Sheets

BICMOS LOGIC CIRCUIT WITH BIPOLAR TRANSISTOR AND MOS TRANSISTOR FORMED ON THE SAME SEMICONDUCTOR SUBSTRATE

This application is a continuation of application Ser. No. 07/735,043, filed Jul. 24, 1991, now abandoned.

BACKGROUND OF THE INVENTION

1. Field of the Invention

The present invention relates to a logic circuit using a bipolar transistor and a MOS transistor and, more particularly, to a Bi-CMOS logic circuit in which a bipolar transistor and a CMOS element are formed on the same semiconductor substrate.

2. Description of the Related Art

The basic arrangement of an ECL logic circuit using a conventional bipolar transistor is shown in FIG. 1. Complementary inputs IN and $\overline{IN}$ are input to an emitter-coupled differential circuit constituted by npn bipolar transistors $Q_1$ and $Q_2$. In this case, when the input IN is a high-potential signal, the transistor $Q_1$ is turned on, and the transistor $Q_2$ is turned off, thereby flowing a current $I_1$ through the transistor $Q_1$. Therefore, the output potential of the transistor $Q_1$ becomes $V_{CC}-I_1R$, where R is the resistance value of resistor $R_1$ and the output potential of the transistor $Q_2$ becomes VCC. It should be noted that R is also the resistance value of resistor $R_2$. The output potentials $V_{CC}-I_1R$ and $V_{CC}$ are level-shifted to $V_{CC}-I_1R -V_f$ and $V_{CC}-V_f$, respectively, by an emitter follower circuit constituted by npn transistors $Q_3$ and $Q_4$. The voltage $V_f$ is a base-emitter forward biasing voltage of each of the bipolar transistors $Q_3$ and $Q_4$.

In the above ECL logic circuit, bipolar transistors are unsaturated. When inequality $I_1R<V_f$ is satisfied due to the transistors $Q_3$ and $Q_4$ of a level shift circuit, the unsaturation of the bipolar transistors is ensured. Therefore, the ECL logic circuit is a logic circuit system having a high-speed operation and a large operation margin of bipolar logic transistors.

The above conventional ECL logic circuit has a merit of a high-speed operation. However, when the load capacitances of the outputs OUT and $\overline{OUT}$ are large, the ECL logic circuit has a problem.

That is, when the potential of the output OUT is pulled up from a low potential to a high potential, since the load is charged by the bipolar transistor $Q_4$, this charging is performed at a sufficiently high speed. However, when the potential of the output OUT is pulled down from the high potential to the low potential, the bipolar transistor $Q_4$ is cut off, discharging is performed by only a constant current source $I_2$. Therefore, when the load capacitance is large, the speed of the pull-up operation is higher than that of the pull-down operation, and the operation speed of the whole circuit is decreased.

When the value of constant current sources $I_2$ and $I_3$ is increased to compensate for this drawback, the operation speed is not decreased, but power consumption in unit gate is increased. Since the ECL logic circuit generally has power consumption larger than that of a CMOS element or other bipolar logic circuits, a countermeasure for increasing the capacity of the constant current source cannot easily be employed.

SUMMARY OF THE INVENTION

It is an object of the present invention to provide a logic circuit having an operation speed equal to that of an ECL logic circuit, small dependency of load capacitance, and low power consumption.

According to the present invention, there is provided a logic circuit comprising a bipolar differential circuit for obtaining first and second outputs which are complementary to each other, a first output circuit for obtaining a first output between a first bipolar transistor having the first output as a control input and a first MOS transistor having the second output as a control input, the first bipolar transistor and the first MOS transistor being connected in series with each other between a constant current source and a power source of the bipolar differential logic circuit, and a second output circuit for obtaining a second output complementary to the first output between a second bipolar transistor having the second output as a control input and a second MOS transistor having the first output as a control input, the second bipolar transistor and the second MOS transistor being connected in series with each other between the constant current source and the power source.

According to the present invention, since a pull-down current of an output circuit (emitter follower) is discharged through a MOS transistor having a large transconductance gm and a constant current source having a large current value, the speed of a pull-down operation is increased. In addition, a constant current source need not be arranged in an output circuit, and the MOS transistor is operated when it is required during a pull-down operation, thereby reducing an extra current. Therefore, a circuit having low power consumption can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
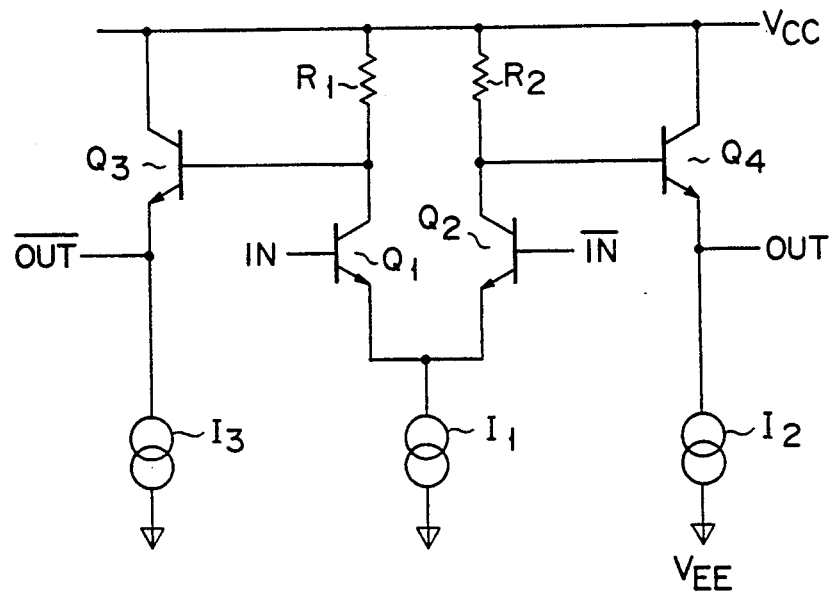
FIG. 1 is a circuit diagram showing a conventional ECL bipolar logic circuit.
Figure 2:
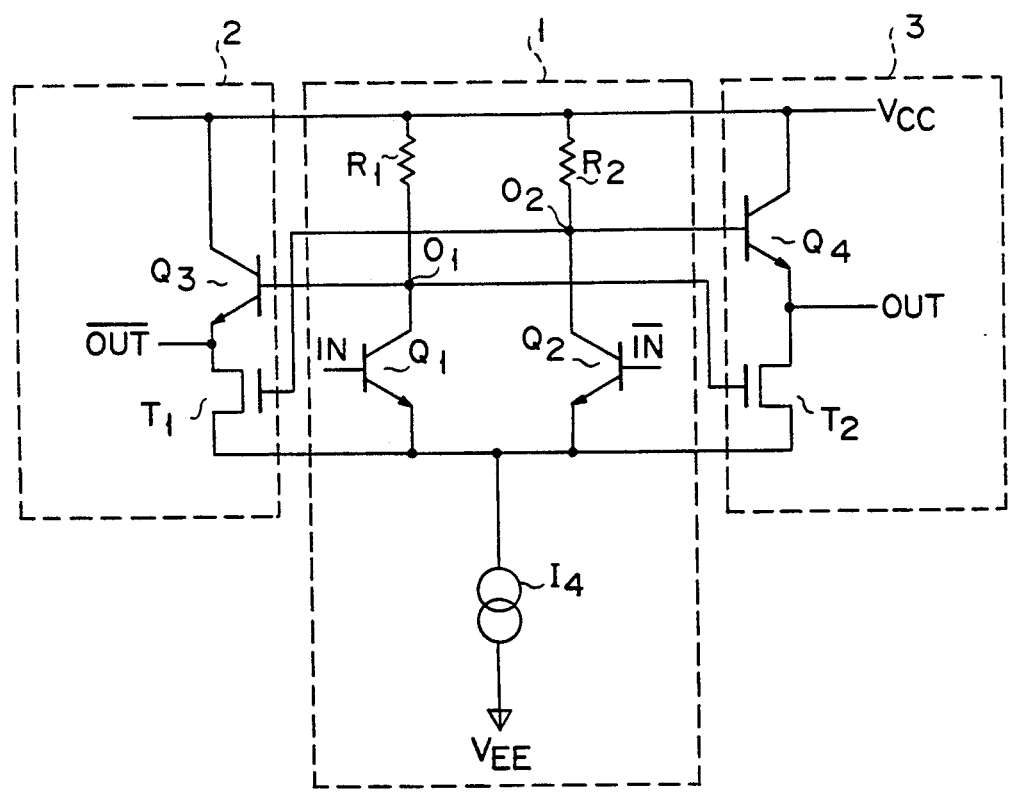
FIG. 2 is a circuit diagram showing a logic circuit according to an embodiment of the present invention.

An embodiment of a logic circuit according to the present invention will be described below with reference to the accompanying drawings. FIG. 2 is a circuit diagram showing a logic circuit according to an embodiment of the present invention, and the same reference numerals as in FIG. 1 denote the same parts in FIG. 2. An emitter-coupled differential circuit 1 is constituted by npn bipolar transistors $Q_1$ and $Q_2$, load resistors $R_1$ and $R_2$, and a constant current source $I_4$. The base input to the transistor $O_1$ is an input IN, and the base input to the transistor $Q_2$ is an inverted input $\overline{IN}$. A first output buffer 2 is constituted by a series circuit of an npn transistor $Q_3$ and an n-channel MOS transistor $T_1$. A second output buffer 3 is constituted by a series circuit of an npn transistor $Q_4$ and an n-channel MOS transistor $T_2$. The constant current source $I_4$ is used as not only the current source of the differential circuit 1, but the current sources of the first and second output buffers 2 and 3. A differential output $O_1$ is applied to the base of the transistor $Q_3$ and the gate of the transistor $T_2$, and a differential output $O_2$ is applied to the gate of the transistor $T_1$ and the base of the transistor $Q_4$. As the outputs of the output buffers 2 and 3, an output $\overline{OUT}$ (having the same phase as that of the input $\overline{IN}$) and an output OUT (having the same phase as that of the input IN) which are complementary to each other are obtained from the junction between the transistors $O_4$ and $T_2$ and the junction between the transistors $Q_3$ and $T_1$, respectively. When the value $I_4$ of the constant current source $I_4$ in FIG. 2 is compared with the value in FIG. 1, the value $I_4$ can be set to $I_4 \approx I_1 + I_2$ or $I_4 \approx I_1 + I_3$. $I_2$ and $I_3$ have substantially the same value. In the circuit in FIG. 2, R (the resistance value of each one of resistor $R_1$ and resistor $R_2$) and I (the current flowing across one of the resistors having the resistance value of R) are set such that the output amplitude is given by $IR = V_f$. It can be considered that power sources are given by $V_{CC} = 0$ [V] and $V_{EE} = -5$ [V].

In FIG. 2, when the input IN of the complementary inputs IN and $\overline{IN}$ of the differential circuit 1 is set to be a high potential and the input $\overline{IN}$ is set to be a low potential, a current flows through a branch circuit on the high-potential side, i.e., the resistor R1 and the transistor Q1, and a voltage drop IR (where R = the resistance of each one of resistor $R_1$ and resistor $R_2$) occurs across the resistor $R_1$. The output terminal $O_1$ is set to be a low potential "$V_{CC} - I_4R$" and the output terminal $O_2$ of a branch circuit on the low potential side, i.e., a circuit constituted by the resistor $R_2$ and the transistor $Q_2$, is charged to be the high potential $V_{CC}$. When the input terminal IN is set to be a high potential, the output $\overline{OUT}$ is set to be a low potential, and the output OUT is set to be a high potential. That is, the output $\overline{OUT}$ is pulled down, and the output OUT is pulled up.

In the pull-down operation, the transistor $Q_3$ is turned off, and the transistor $T_1$ is turned on. Therefore, the output $\overline{OUT}$ is discharged through the transistor $T_1$ and the constant current source $I_4$.

In the pull-up operation, the transistor $Q_4$ is turned on, and the transistor $T_2$ is turned off. Therefore, the output OUT is charged through the transistor $Q_4$.

In the circuit in FIG. 2, the MOS transistor of the output buffer circuit on the pull-up operation side e.g., the MOS transistor $T_2$ when the input IN is set to be a high potential is turned off. Thus, the output OUT is charged through an unsaturated transistor $Q_4$ at a high speed. The MOS transistor $T_1$ of the output buffer circuit on the pull-down side can be pulled-down at a high speed, by setting a large transconductance gm to the MOS transistor $T_1$, and a large capacity to the constant current source $I_4$. Constant current sources $I_2$ and $I_3$ of the output buffer used in the conventional circuit need not be provided in the circuit in FIG. 2, and the MOS transistor ($T_1$ or $T_2$) of the output buffer is turned on only when it is required. Therefore, a wasteful current is small, and a circuit having low power consumption can be obtained.

Figure 3:
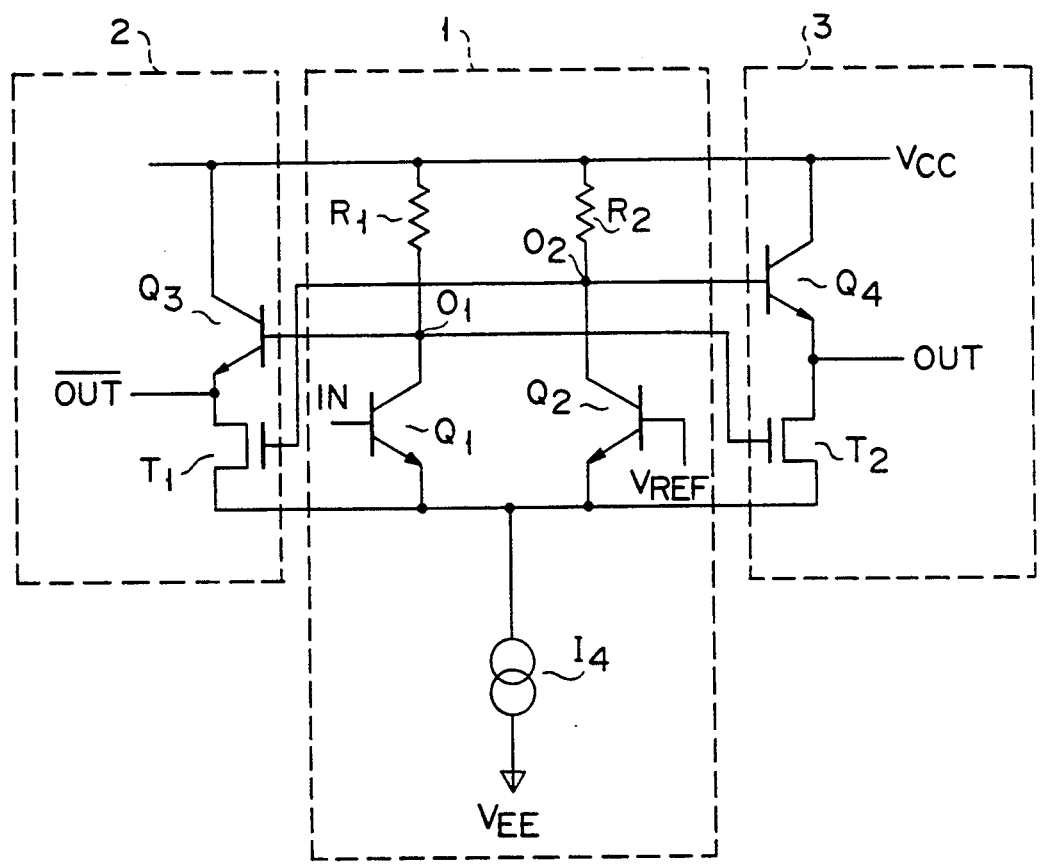
FIG. 3 is a circuit diagram showing a logic circuit according to another embodiment of the present invention.

The present invention is not limited to the above embodiment, and various modifications can be effected. For example, in this embodiment, the emitter-coupled differential circuit 1 is used as a bipolar differential logic circuit, and the complementary inputs IN and $\overline{IN}$ are used as the inputs to the circuit 1. As shown in FIG. 3, a reference input $V_{REF}$ may be used as one of the inputs, e.g., the input $\overline{IN}$. In addition, a logic circuit having OR and NOR outputs, a logic circuit having AND and NAND outputs, or the like can be used in place of the differential circuit 1, thereby driving the bipolar transistor and a MOS transistor of an output circuit (output buffer). Although the logic amplitude is set to be a voltage $V_f$ (base-emitter forward biasing voltage) in this embodiment, the logic amplitude may be set to be other logic amplitudes. For example, the output amplitude may be further increased.

As described above, according to the present invention, large-current discharging of an output in a circuit on the pull-down side can be performed. Since charging is performed in the circuit on the pull-up side at a high speed, a high-speed operation can be performed in the whole circuit. In addition, the number of constant current sources becomes small, and a current flows only when it is required. Therefore, a circuit having low power consumption can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

We claim:

1. A logic circuit comprising:
   a bipolar differential circuit for obtaining first and second differential circuit outputs which are complementary to each other, said bipolar differential circuit having a terminal that is directly connected to a constant current source;
   a first output circuit for obtaining a first output circuit output between a first bipolar transistor having the first differential circuit output as a control input and a first MOS transistor having the second differential circuit output as a control input, said first bipolar transistor and said first MOS transistor being connected in series with each other between said constant current source and a power source of said bipolar differential logic circuit; and
   a second output circuit for obtaining a second output circuit output complementary to the first output circuit output between a second bipolar transistor having the second differential circuit output as a control input and a second MOS transistor having the first differential circuit output as a control input, said second bipolar transistor and said second MOS transistor being connected in series with each other between said constant current source and said power source.

2. A logic circuit comprising:
   a first bipolar transistor of a first polarity having abase for receiving a first input;

a second bipolar transistor of a first polarity having a base receiving a second input which is an inverted input of the first input and an emitter connected to an emitter of said first bipolar transistor to form an emitter node;

a first resistor element having one terminal connected to a first potential power source and the other terminal connected to a collector of said first bipolar transistor;

a second resistor element having one terminal connected to said first potential power source and the other terminal connected to a collector of said second bipolar transistor;

a third bipolar transistor of the first polarity having a collector connected to said first potential power source, a base connected to the collector of said first bipolar transistor, and an emitter serving as a first output;

a fourth bipolar transistor of the first polarity having a collector connected to said first potential power source, a base connected to the collector of said second bipolar transistor, and an emitter serving as a second output inverted to the first output;

a first MOS FET of a first conductivity type having a gate connected to the collector of said second bipolar transistor, a source connected to the emitter of said first bipolar transistor, and a drain serving as the first output;

a second MOS FET of the first conductivity type having a gate connected to the collector of said first bipolar transistor, a source connected to the emitter of said second bipolar transistor, and a drain serving as a second output; and a constant current source provided between the said emitter node of said first and second bipolar transistors and a second potential power source.

3. A logic circuit comprising:

a first bipolar transistor of a first polarity having a base for receiving a first input;

a second bipolar transistor of a first polarity having a base receiving a second input which is a reference input and an emitter connected to an emitter of said first bipolar transistor to form an emitter node;

a first resistor element having one terminal connected to a first potential power source and the other terminal connected to a collector of said first bipolar transistor;

a second resistor element having one terminal connected to said first potential power source and the other terminal connected to a collector of said second bipolar transistor;

a third bipolar transistor of the first polarity having a collector connected to said first potential power source, a base connected to the collector of said first bipolar transistor, and an emitter serving as a first output;

a fourth bipolar transistor of the first polarity having a collector connected to said first potential power source, a base connected to the collector of said second bipolar transistor, and an emitter serving as a second output inverted to the first output;

a first MOS FET of a first conductivity type having a gate connected to the collector of said second bipolar transistor, a source connected to the emitter of said first bipolar transistor, and a drain serving as the first output;

a second MOS FET of the first conductivity type having a gate connected to the collector of said first bipolar transistor, a source connected to the emitter of said second bipolar transistor, and a drain serving as a second output; and a constant current source provided between said emitter node of said first and second bipolar transistors and a second potential power source.

4. A logic circuit according to claim 2, wherein said first to fourth bipolar transistors are npn transistors, and said first and second MOS FET are n channel MOS transistors.

5. A logic circuit according to claim 3, wherein said first to fourth bipolar transistors are npn transistors, and said first and second MOS FET are n channel MOS transistors.

* * * * *

UNITED STATES PATENT AND TRADEMARK OFFICE
CERTIFICATE OF CORRECTION

PATENT NO. : 5,331,225
DATED : July 19, 1994
INVENTOR(S) : Masataka Matsui et al It is certified that error appears in the above-indentified patent and that said Letters Patent is hereby corrected as shown below:

On the title page:
Attorney, Agent, or Firm, Front Page, Line 2 change "Duner" to --Dunner--.

Claim 2, Column 4, Penultimate Line 68, change "abase" to --a base--.

Claim 2, Column 5, Line 35 delete "the".

Signed and Sealed this

Eighteenth Day of April, 1995

Attest:

BRUCE LEHMAN

*Attesting Officer*

*Commissioner of Patents and Trademarks*